United States Patent
Chou et al.

(10) Patent No.: US 7,183,698 B1
(45) Date of Patent: Feb. 27, 2007

(54) PIEZOELECTRIC STRUCTURE

(75) Inventors: Chin-Wen Chou, Taipei Hsien (TW);
Ying-Nan Cheng, Taipei Hsien (TW);
Yu-Liang Cheng, Taipei Hsien (TW)

(73) Assignee: Zippy Technology Corp., Taipei Hsien (TW)

( * ) Notice: Subject to any disclaimer, the term of this patent is extended or adjusted under 35 U.S.C. 154(b) by 0 days.

(21) Appl. No.: 11/212,656

(22) Filed: Aug. 29, 2005

(51) Int. Cl.
*H01L 41/107* (2006.01)

(52) U.S. Cl. .................. 310/359; 310/366; 310/367; 310/369

(58) Field of Classification Search ............... 310/320, 310/340, 348, 365–369, 359
See application file for complete search history.

(56) References Cited

U.S. PATENT DOCUMENTS

| | | | | |
|---|---|---|---|---|
| 1,830,322 A | * | 11/1931 | Hund | 331/40 |
| 2,859,346 A | * | 11/1958 | Firestone et al. | 331/37 |
| 2,953,755 A | * | 9/1960 | Mattiat | 333/187 |
| 3,356,850 A | * | 12/1967 | Fleming-Williams | 250/214.1 |
| 3,569,750 A | * | 3/1971 | Beaver | 310/320 |
| 3,694,677 A | * | 9/1972 | Guttwein et al. | 310/369 |
| 3,764,848 A | * | 10/1973 | Berlincourt | 315/55 |
| 3,838,366 A | * | 9/1974 | Coussot | 333/192 |
| 4,870,313 A | * | 9/1989 | Hirama et al. | 310/320 |
| 6,707,235 B1 | | 3/2004 | Brebøl | |
| 6,787,048 B2 | * | 9/2004 | Bradley et al. | 216/13 |
| 7,098,574 B2 | * | 8/2006 | Iwata | 310/320 |
| 2002/0190611 A1 | * | 12/2002 | Nakatsuka et al. | 310/359 |
| 2004/0056567 A1 | * | 3/2004 | Menzel | 310/367 |

FOREIGN PATENT DOCUMENTS

| | | | |
|---|---|---|---|
| JP | 62-131617 | * | 6/1987 |
| JP | 09321363 A | * | 12/1997 |
| JP | 2003-133890 | * | 5/2003 |
| WO | WO-2004-102688 | * | 11/2004 |

* cited by examiner

*Primary Examiner*—Thomas M. Dougherty
(74) *Attorney, Agent, or Firm*—Birch, Stewart, Kolasch & Birch, LLP

(57) ABSTRACT

A piezoelectric structure receives input from a voltage source to generate polarization and output voltage. Two surfaces are formed on the direction normal to the polarized direction. One surface has an input electrode electrically connecting to the voltage source and an output electrode to output voltage. Another surface has a ground electrode. The distance between the input electrode and the ground electrode is different from the distance between the output electrode and the ground electrode. Through the height difference of the two electrodes, the step-up and step-down ratio can be altered.

4 Claims, 5 Drawing Sheets

PIEZOELECTRIC STRUCTURE

FIELD OF THE INVENTION

The present invention relates to a piezoelectric structure and particularly to a piezoelectric structure that is capable of altering the step-up ratio and step-down ratio.

BACKGROUND OF THE INVENTION

Piezoelectricity basically is an energy transformation phenomenon between mechanical energy and electrical energy. As there is a cause and effect relationship between electric charge and strain, for an object which can generate piezoelectricity, as long as its crystal structure can generate electron dipole moment (EDM) when subject to an external force, transformation between the mechanical energy and electrical energy occurs. Then piezoelectricity can take place.

Generation of EDM is caused by a special arrangement of the positive ions and negative ions inside the crystal. Different crystal lattice systems in the material can generate different EDM. The basic condition is the asymmetrical center of the crystal lattice. If there is a symmetrical center in the crystal lattice, the positive ions and the negative ions will be neutralized. Then EDM cannot be generated. And transformation between the mechanical energy and electrical energy does not take place. Transformation between the mechanical energy and electrical energy generally has three forms: (1) transforming mechanical energy to kinetic energy, (2) transforming electrical energy to mechanical energy, and (3) transforming electrical energy to mechanical energy, then to electrical energy again to be output. Piezoelectric ceramics can transform mechanical energy to electrical energy and vice versus, thus is widely used. It may be used to fabricate pressure detection elements, accelerators, micromotors and the like. The piezoelectric film can meet the requirements of thin and light that are demanded by many modern electronic products, hence it may be used in electronic elements for bio-detection and communication and the like. Its application potentials are highly appreciated in academics and industries.

Refer to FIGS. 1A and 1B for a conventional piezoelectric structure. Its structure is based on a principle announced by Berlincourt in 1973 named "unipoled PZT". The relationship of thickness of the polarized areas of the piezoelectric structure that are corresponding to the input/output areas is changeable. The generated polarization process can alter the step-up ratio and step-down ratio of the piezoelectric structure. This is the principle of the structure. However, in the conventional techniques, changing the polarized areas of the input electrode and the output electrode by fixing the distance between the input electrode/output electrode and the ground electrode of the piezoelectric structure (namely $d_i=d_o$) to alter the step-up ratio and step-down ratio. This causes a problem which is if there is a desire to alter the step-up or step-down ratio, the polarized areas of the electrode and output electrode must be changed. Hence the size of the piezoelectric structure has to be increased or reduced. Its industrial applicability is greatly affected by the fabrication techniques and installation space of the piezoelectric structure.

U.S. Pat. No. 6,707,235 discloses an annular piezoelectric structure which has a first portion and a second portion. These two portions connect to an AC power supply. And other portions can produce and transform vibration generated by piezoelectric structure. The polarized direction of the annular piezoelectric structure is normal to the perimeter surface of the annular body. It generates different step-up and step-down ratios through different shapes of the piezoelectric structure. The different shapes of the piezoelectric structure create difficulty in manufacturing.

SUMMARY OF THE INVENTION

Therefore the primary object of the present invention is to solve the aforesaid disadvantages. The invention aims to alter the step-up ratio and step-down ratio of the piezoelectric structure through the polarized areas of the piezoelectric material and the relative height difference between two electrodes of the input and output voltages. Compared with the conventional piezoelectric structure of the same input voltage and similar size, the invention can provide a higher or lower output voltage and save installation space.

Another object of the invention is to provide a piezoelectric structure with a profile which is changeable easily. Compared with the conventional techniques of the same input voltage, the invention can generate a higher or lower output voltage. Fabrication process and time also can be reduced.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
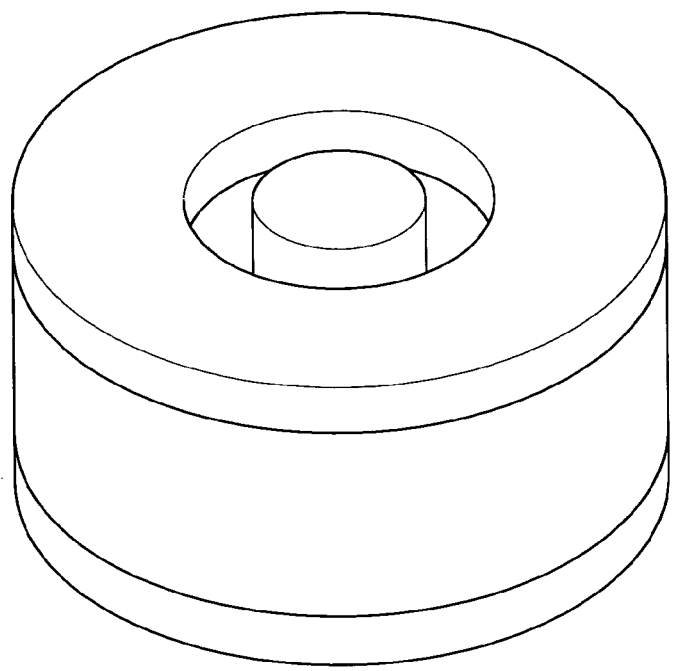
FIG. 1A is a perspective view of a conventional piezoelectric structure.
Figure 1B:
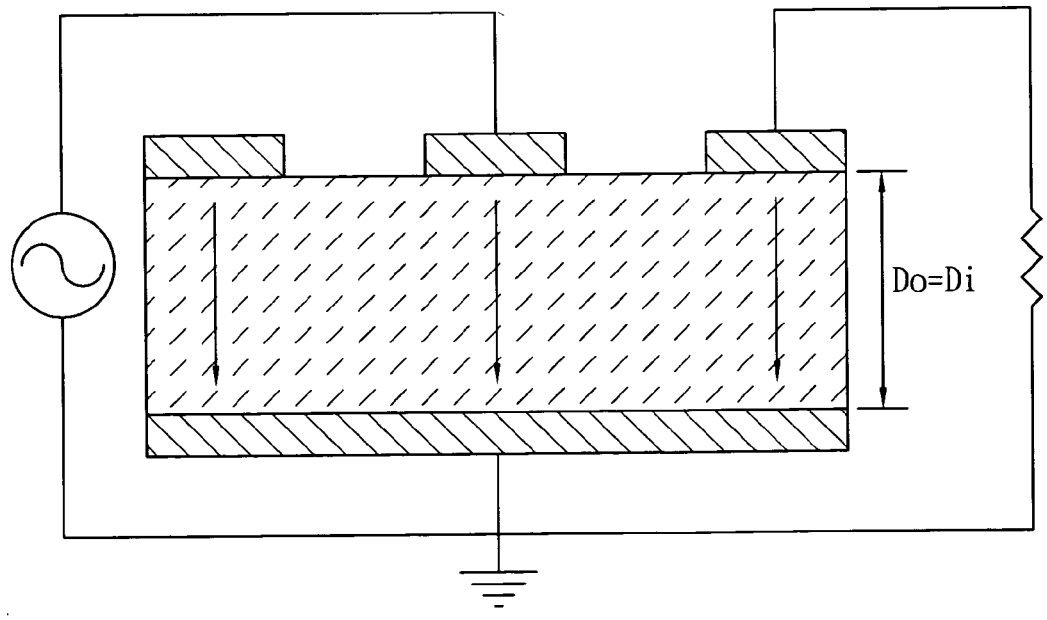
FIG. 1B is a sectional view of a conventional piezoelectric structure.
Figure 2A:
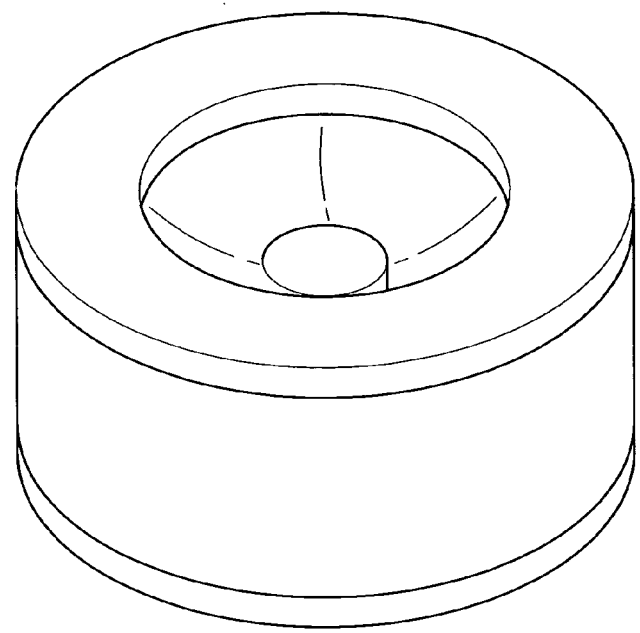
FIGS. 2A and 3A are perspective views of the present invention.
Figure 2B:
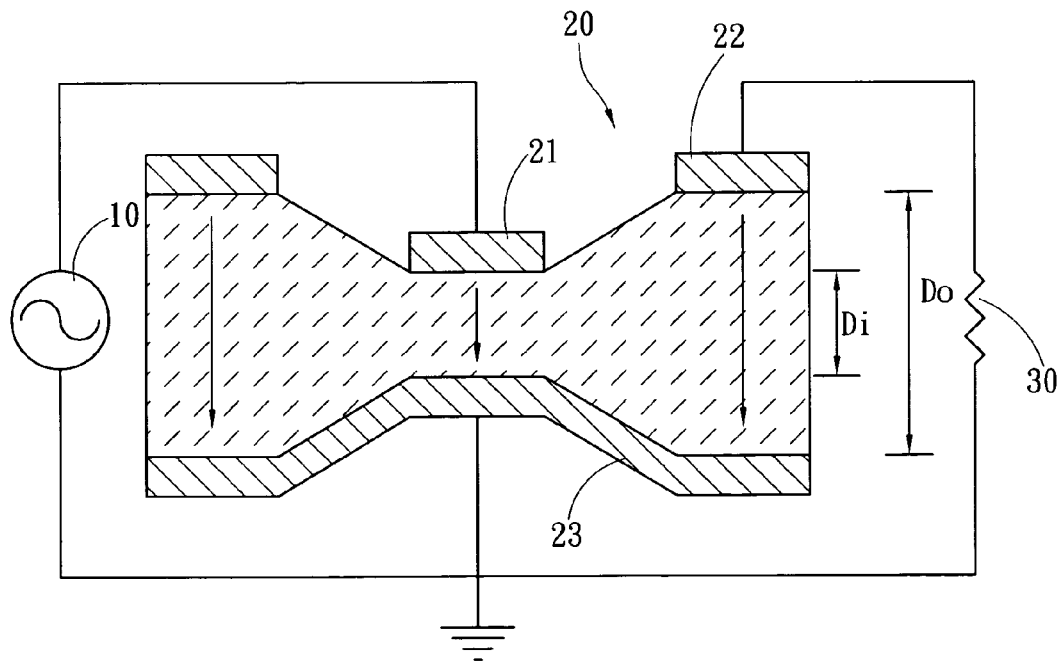
FIGS. 2B and 3B are sectional views of the present invention.
Figure 3A:
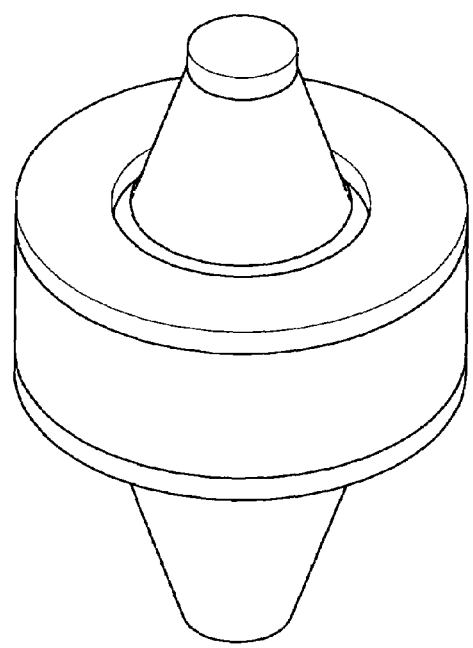
Figure 3B:
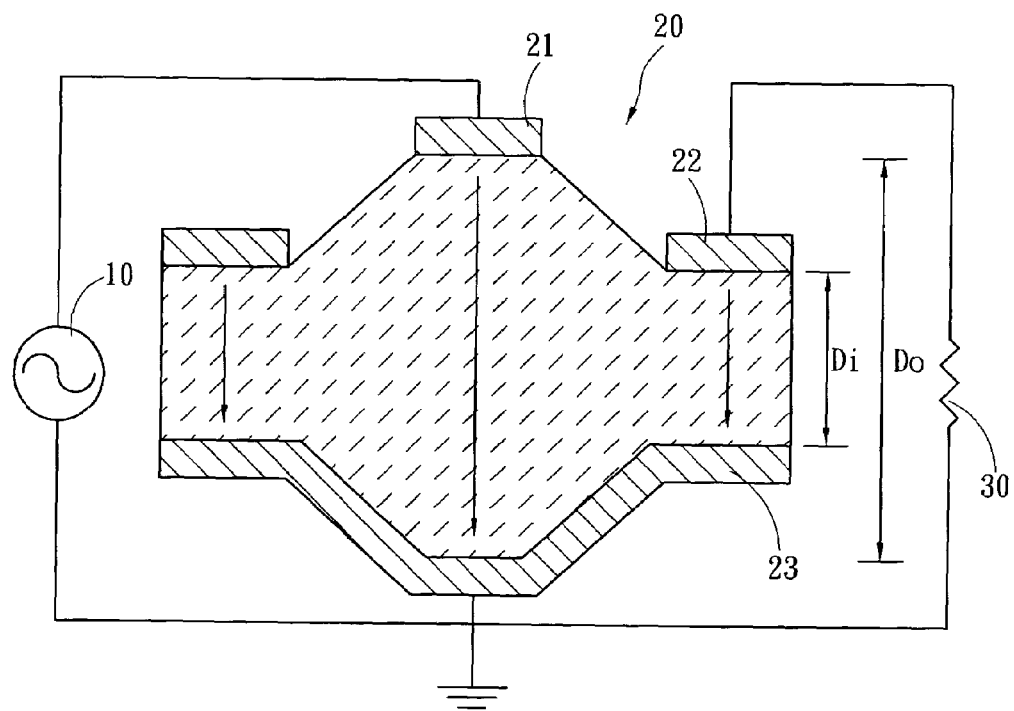

Please refer to FIGS. 2A, 2B, 3A and 3B. The piezoelectric structure 20 according to the invention is connected to a voltage source 10. The piezoelectric structure 20 has a polarized direction, an input electrode 21 electrically connected to the voltage source 10 that is normal to one of two surfaces of the polarization, and an output electric electrode 22 to output a higher or lower voltage after the piezoelectric structure 20 is activated. There is another surface other than the surface where the input and output electrodes are located that has a ground electrode 23 which is grounded. The main feature of the invention is that the distance between the input electrode 21 or the output electrode 22 and the ground electrode 23 is not equal because of the thickness of the piezoelectric plate.

According to the equation announced by Berlincourt, assumed the conventional step-up or step-down ratio is a $\alpha_1$, the step-up or step-down ratio of the invention is a $\alpha_2$, the conventional input/output electrode polarized areas are respectively $A_1$ and $A_o$, the input/output electrode polarized areas of the invention are respectively $a_1$ and $a_o$, the distances between the conventional input/output electrodes and the ground electrode 23 are respectively $D_1$ and $D_o$, and the distances between the input/output electrodes and the ground electrode 23 of the invention are respectively $d_1$ and $d_o$, when $A_i = a_i$, $A_o = a_o$, $\alpha_1 = (A_i/D_i^2)/(A_o/D_o^2)$, therefore $\alpha_1 = A_i D_o^2 / A_o D_i^2$ According to the principle set forth above, $\alpha_2 = (a_i/d_1^2)/(a_o/d_o^2)$, therefore $\alpha_2 = a_i d_o^2 / a_o d_i^2$ Hence according to the invention, the distance between the output electrode 22 and the ground electrode 23 is not equal to the distance between the input electrode 21 and the ground electrode 23. Referring to the drawings, with $d_o < d_1$, the ratio of $\alpha_1$ and $\alpha_2$ is the conventional step-up or step-down ratio against the step-up or step-down ratio of the invention. Through that ratio, by altering the distance between the input electrode 21 or output electrode 22 and the ground electrode 23, the step-up or step-down ratio of the piezoelectric structure 20 can be adjusted. Thereby a desired output voltage may be selected according to the duty voltage required for a load 30.

Figure 4:
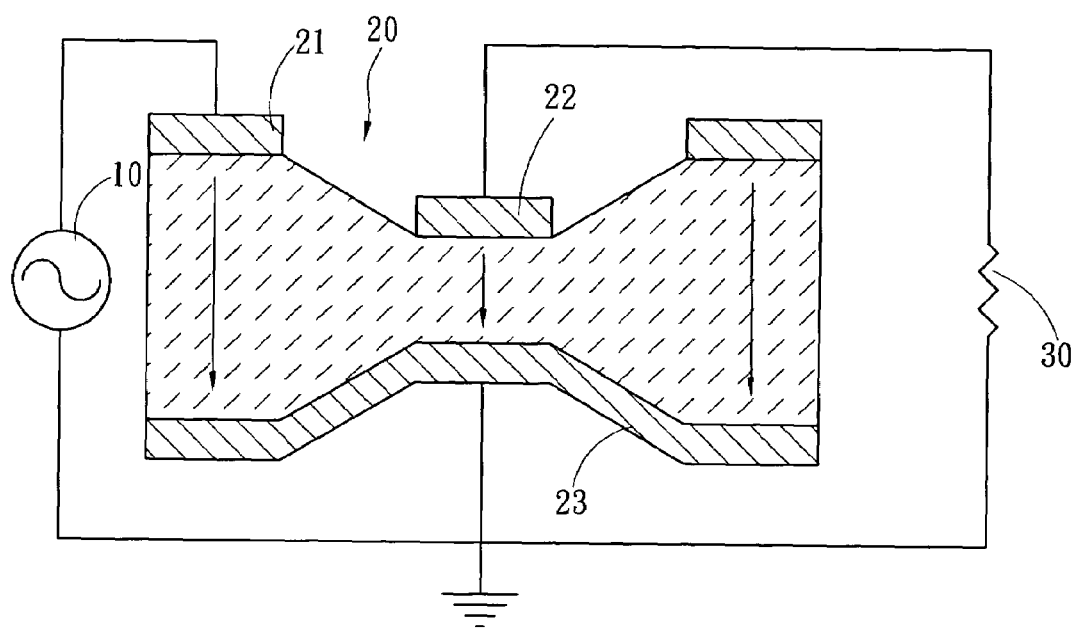
FIG. 4 is a schematic view of an embodiment of the present invention.

Refer to FIG. 4 for an embodiment of the invention. The input electrode 21 and output electrode 22 may be changed, and the input electrode 21 is located in the range covered by the output electrode 22, or the output electrode 22 may be located in the range covered by the input electrode 21 to generate a different step-up or step-down ratio. Through the combination of different polarized area of the electrodes 21 and 22, and altering distance between the input and output electrodes 21, 22 and the ground electrode 23, different output voltages can be achieved and supplied corresponding to the duty voltage required by the load 30.

Figure 5A:
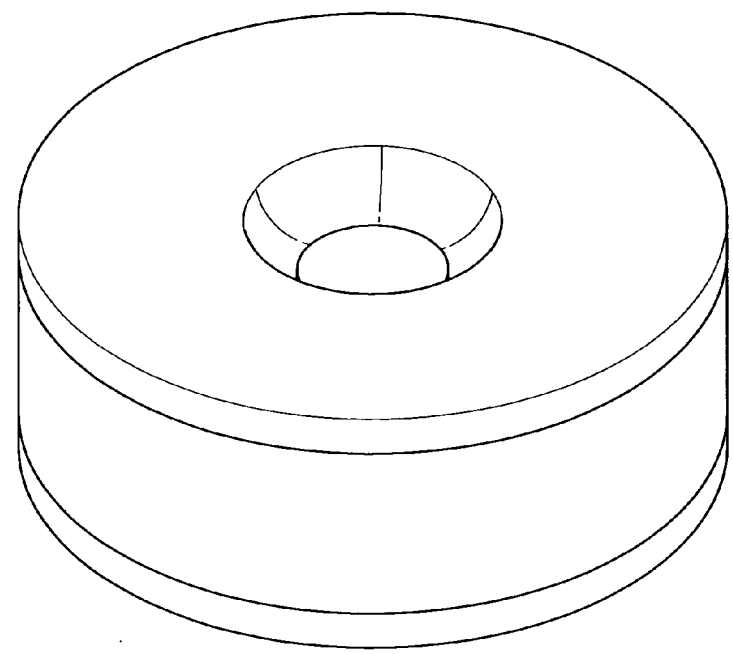
FIGS. 5A and 5B are schematic views of another embodiment of the invention.
Figure 5B:
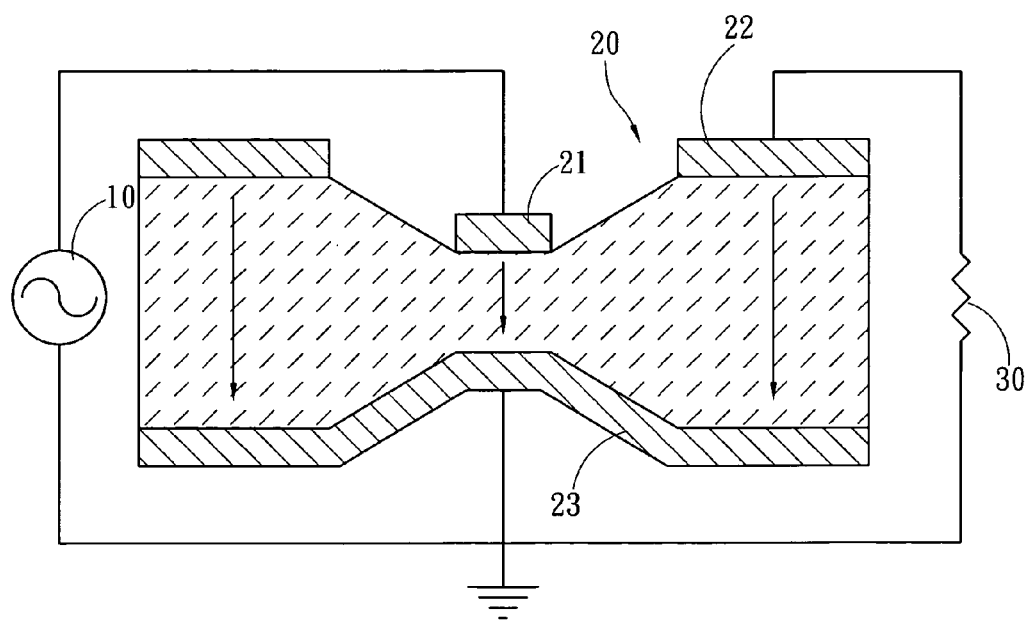

Refer to FIGS. 5A and 5B for another embodiment of the invention, and also refer to the principle of the piezoelectric structure 20 previously discussed. The ratio of polarized area between the output electrode 22 and the input electrode 21 may be same or different to get different output voltage. Adopted the method shown in FIG. 3, by altering the location of the input end of the load 30 to the output electrode 22 of the piezoelectric structure 20 that are connected electrically (altering the output electrode 22 to be surrounded by the input electrode 21), many different combinations of step-up and step-down ratios can be generated to provide a desired duty voltage for the load 30.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A piezoelectric structure connected electrically to an input voltage source to be activated to generate an output voltage, comprising:
    two surfaces of polarization opposite to each other;
    an input electrode located on one surface and connecting electrically to the input voltage source;
    an output electrode to generate the output voltage, located on said one surface;
    a portion of said one surface between said input electrode and said output electrode being sloped;
    a ground electrode on another surface opposite to the input and output electrodes; and
    a first spacing between the input electrode and the ground electrode being different from a second spacing between the output electrode and the ground electrode.

2. The piezoelectric structure of claim 1, wherein the output electrode and the input electrode form respectively an equal polarized area on the piezoelectric structure.

3. The piezoelectric structure of claim 1, wherein the output electrode and the input electrode form respectively an unequal polarized area on the piezoelectric structure.

4. The piezoelectric structure of claim 1 wherein the output voltage is a function of the input voltage, said first spacing and said second spacing.

* * * * *